United States Patent
Puckett et al.

(10) Patent No.: US 11,199,733 B2
(45) Date of Patent: Dec. 14, 2021

(54) INTEGRATED PHOTONICS QUANTUM VECTOR MAGNETOMETER

(71) Applicant: Honeywell International Inc., Morris Plains, NJ (US)

(72) Inventors: Matthew Wade Puckett, Phoenix, AZ (US); Neal Eldrich Solmeyer, Edina, MN (US); Steven Tin, Edina, MN (US)

(73) Assignee: Honeywell International Inc., Charlotte, NC (US)

( * ) Notice: Subject to any disclaimer, the term of this patent is extended or adjusted under 35 U.S.C. 154(b) by 1 day.

(21) Appl. No.: 16/788,819

(22) Filed: Feb. 12, 2020

(65) Prior Publication Data

US 2021/0103166 A1 Apr. 8, 2021

Related U.S. Application Data

(60) Provisional application No. 62/912,533, filed on Oct. 8, 2019.

(51) Int. Cl.
*G01R 33/032* (2006.01)
*G02F 1/09* (2006.01)
*G01J 1/04* (2006.01)

(52) U.S. Cl.
CPC .............. *G02F 1/09* (2013.01); *G01J 1/0425* (2013.01); *G01R 33/032* (2013.01)

(58) Field of Classification Search
None
See application file for complete search history.

(56) References Cited

U.S. PATENT DOCUMENTS

| 9,910,105 B2 | 3/2018 | Boesch et al. |
| 10,317,279 B2 | 6/2019 | Bruce et al. |
| 10,330,744 B2 | 6/2019 | Luzod |

(Continued)

FOREIGN PATENT DOCUMENTS

WO   2019002576 A1   1/2019

OTHER PUBLICATIONS

Bougas et al., "On the Possibility of Miniature Diamond-Based Magnetometers Using Waveguide Geometries", Micromachines, Jun. 1, 2018, pp. 1-11, MDPI.

(Continued)

*Primary Examiner* — Jas A Sanghera
(74) *Attorney, Agent, or Firm* — Fogg & Powers LLC

(57) ABSTRACT

Systems and methods for an integrated photonics quantum vector magnetometer are provided herein. In certain embodiments, a device includes a substrate; a radio frequency emitter that emits energy in a range of radio frequencies; and a waveguide layer formed on the substrate. The waveguide layer includes a first waveguide of a first material, wherein a probe laser is propagating within the first waveguide; and a second waveguide, wherein the second waveguide is positioned proximate to the first waveguide along a coupling length such that a pump laser propagating within the second waveguide is coupled into the first waveguide along the coupling length, wherein the pump laser causes the first material to absorb the probe laser at one or more frequencies in the range of frequencies. Moreover, the device includes a processing device that calculates a magnetic field strength based on an identification of the one or more frequencies.

20 Claims, 5 Drawing Sheets

(56) References Cited

U.S. PATENT DOCUMENTS

| | | | |
|---|---|---|---|
| 10,901,054 B1 | 1/2021 | Chen et al. | |
| 2014/0354275 A1* | 12/2014 | Sheng | G01R 33/26 |
| | | | 324/244.1 |
| 2016/0231394 A1 | 8/2016 | Manickam et al. | |
| 2017/0023487 A1 | 1/2017 | Boesch | |
| 2017/0343621 A1 | 11/2017 | Hahn et al. | |
| 2018/0275210 A1 | 9/2018 | Luzod | |
| 2019/0018076 A1 | 1/2019 | Hahn et al. | |
| 2019/0219645 A1 | 7/2019 | Hahn et al. | |
| 2021/0132163 A1 | 5/2021 | Puckett et al. | |

OTHER PUBLICATIONS

Jensen et al., "Cavity-Enhanced Room-Temperature Magnetometry Using Absorption by Nitrogen-Vacancy Centers in Diamond", Physical Review Letters 112, Apr. 23, 2014, pp. (160802-1)-(160802-5), American Physical Society.

U.S. Patent and Trademark Office, "Notice of Allowance", U.S. Appl. No. 16/786,495, filed Apr. 30, 2021, pp. 1 through 18, Published: US.

U.S. Patent and Trademark Office, "Corrected Notice of Allowability", U.S. Appl. No. 16/786,495, filed May 14, 2021, pp. 1 through 6, Published: US.

\* cited by examiner

INTEGRATED PHOTONICS QUANTUM VECTOR MAGNETOMETER

CROSS-REFERENCE TO RELATED APPLICATION

This application claims the benefit of U.S. Provisional Application Ser. No. 62/912,533, filed Oct. 8, 2019, and titled "INTEGRATED PHOTONICS QUANTUM VECTOR MAGNETOMETER," which is hereby incorporated herein by reference.

This application is related to U.S. Non-Provisional application Ser. No. 16/786,495, filed Feb. 10, 2020, and titled "QUANTUM VECTOR MAGNETOMETER BASED ON NANOSCALE FIN WAVEGUIDE," which is hereby incorporated herein by reference.

BACKGROUND

Many applications use precise measurements of magnetic fields. In particular, applications attempt to measure vector magnetic fields to provide desired functionality within a system. For example, applications may measure magnetic fields in anomaly based navigation and in dipole beacon-based navigation. These applications typically require magnetic sensors with high sensitivity; low size, weight, and power; and the ability to operate in an earth field. Some technologies (i.e., SQUID, atomic based magnetometry) are capable of providing high sensitivity that is useful in certain applications. However, some of these technologies have drawbacks. For example, SQUID uses cryogenic refrigeration, which adds to the size and power consumption of the magnetometer. Moreover, atomic based magnetometers are unable to operate in an earth field. Further, the aforementioned technologies use at least three sensors to provide vector information.

SUMMARY

Systems and methods for an integrated photonics quantum vector magnetometer are provided herein. In certain embodiments, a device includes a substrate. Also, the device includes a radio frequency emitter that emits energy in a range of radio frequencies. Further, the device includes a waveguide layer formed on the substrate. The waveguide layer includes a first waveguide of a first material, wherein a probe laser is propagating within the first waveguide. Additionally, the waveguide layer includes a second waveguide, wherein the second waveguide is positioned proximate to the first waveguide along a coupling length such that a pump laser propagating within the second waveguide is coupled into the first waveguide along the coupling length, wherein the pump laser causes the first material to absorb the probe laser at one or more frequencies in the range of frequencies. Moreover, the device includes a processing device that calculates a magnetic field strength based on an identification of the one or more frequencies.

DRAWINGS

Understanding that the drawings depict only some embodiments and are not therefore to be considered limiting in scope, the exemplary embodiments will be described with additional specificity and detail using the accompanying drawings, in which.

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Methods and systems for an integrated photonics quantum vector magnetometer are provided herein. In particular, a magnetometer may be fabricated as a parallel waveguide structure with a first waveguide of a first material and a second waveguide of a second material. A pump laser may be introduced into the second waveguide where the pump laser is coupled from the second waveguide into the first waveguide along the length through which the first waveguide and the second waveguide are parallel with one another. Further, a probe laser may be introduced into the first waveguide in the presence of a microwave signal. The probe laser may then be absorbed by the material of the first waveguide at a particular frequency of the microwave signal. Additionally, a system may determine magnetic vectors based on the frequency(ies) at which the probe laser is absorbed by the material of the first waveguide.

Figure 1:
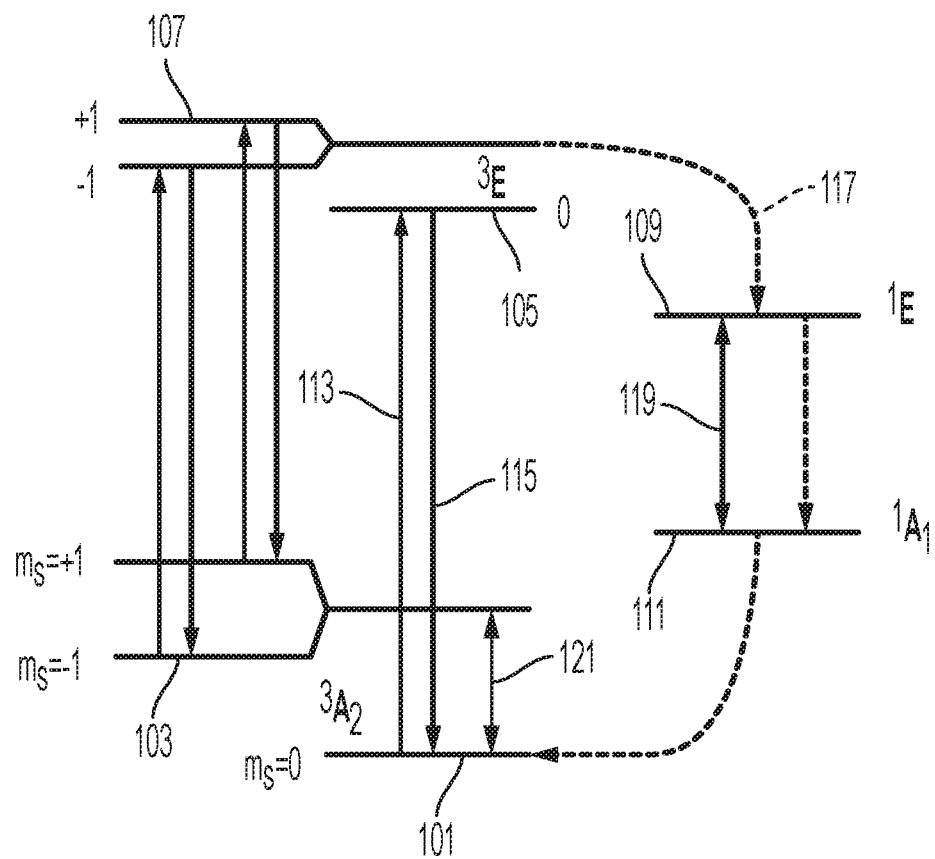
FIG. 1 is a diagram illustrating transitions between the various states of a particular material used for fabricating a magnetometer according to an aspect of the present disclosure.

FIG. 1 is a diagram illustrating transitions between the various states of a particular material used for fabricating a magnetometer. For example, some materials may have certain physical characteristics that allow the material to be responsive to magnetic fields. Examples of materials that are responsive to magnetic fields may include nitrogen vacancy (NV) diamond, silicon carbide, or other material having similar physical characteristics. As used herein, NV diamond may refer to a diamond material having multiple point defects, where a point defect is a nearest-neighbor pair of a nitrogen atom substituted for a carbon atom and a lattice vacancy. A first waveguide may be fabricated from material that responds to magnetic fields.

As illustrated, an exemplary material that responds to magnetic fields may have a ground state that is a spin triplet state. In particular, the ground state may have multiple spin projections: a ground antiparallel 101 of spin projection 0 and ground parallel spins 103 with spin projections of +/−1, where the ground antiparallel spins 101 and the ground parallel spins 103 are separated by a resonant frequency 121. For example, in the absence of a magnetic field, when the material is NV diamond, the resonant frequency 121 may be equal to 2.87 GHz. Additionally, point defects within the material may be optically excited through spin conserving transitions to a spin triplet excited level, where the triplet excited level also has multiple spin projections: an excited antiparallel spin 105 of spin projection 0 and excited parallel spins 107 with spin projections of +/−1. To optically excite the point defects, the first material may be exposed to a pump light having a particular frequency. For example, in NV diamond, a laser having a wavelength of 532 nm may cause spin conserving transitions from the ground triplet state to the excited triplet states.

When point defects within the first material are at the excited state, the defects may relax either through a radiative transition 115 or through an intersystem crossing 117. When a point defect relaxes through a radiative transition 115, the point defect may fluoresce and return to the ground triplet states. For example, NV diamond point defects may emit light having a wavelength of 637 nm during radiative transitions 115. Conversely, when a point defect relaxes through an intersystem crossing 117, the point defect will not fluoresce and will transition to a shelved state, where the shelved state may be a shelved ground state 111 or a shelved excited state 109. Additionally, when point defects are in one of the shelved states 109 and 111, the point defects may absorb a probe laser 119 having a particular frequency. For example, NV diamond point defects in the shelved states 109 and 111 may absorb a probe laser 119 having a wavelength of 1042 nm.

In certain embodiments, a microwave frequency may be applied to the material to increase the rate of intersystem crossings 117 as compared to radiative transitions 115. In the material, non-radiative intersystem crossings 117 may be strongly spin selective. For example, point defects having a parallel spin 107 are more likely to experience an intersystem crossing 117 to the shelved states 109 and 111. In contrast, point defects having the excited antiparallel spin 105 are more likely to experience a radiative transition back to the ground triplet state. To increase the probability of intersystem crossings, a microwave frequency may be applied to the material that is equal to the resonant frequency 121 for the material. For example, when the material is NV diamond, the resonant frequency 121 may be 2.87 GHz. Accordingly, applying a radio frequency of 2.87 GHz to the material may increase the probability of intersystem crossings 117 to the shelved states 109 and 111.

Additionally, when a microwave signal at the resonant frequency 121 is applied to the material, the probe laser 119 is more likely to be absorbed by the material as the population of point defects at the shelved states 109 and 111 within the material is greater than when the material is not exposed to the RF energy at the resonant frequency 121. Accordingly, when the probe laser 119 is applied to the material in the absence of the microwave signal at the resonant frequency, the probe laser 119 is absorbed by the material with less frequency. For example, when NV diamond material is exposed to a microwave signal having a resonant frequency 121 of 2.87 GHz, the NV diamond material may begin to absorb a probe laser 119 having a wavelength of 1042 nm at an increased rate.

In further embodiments, the resonant frequency 121 for the material may change in the presence of a magnetic field. For example, when the material is exposed to a magnetic field, the Zeeman effect may cause the resonant frequency to experience a shift in proportion to the strength of the experienced magnetic field. In particular, in the presence of a magnetic field the resonance frequency 121 may split into two different resonant frequencies 121, where the difference between the two resonant frequencies 121 is proportional to the experienced magnetic field. Accordingly, the resonant frequency 121 at which a probe laser 119 is absorbed by point defects in the material may be monitored to determine the strength of a magnetic field experienced by the material.

Additionally, the point defects within the material may be in one of multiple different orientations. For example, when the material is NV diamond, each point defect may be in one of four different orientations. Additionally, the material may have many point defects in each of the four different orientations. Accordingly, vector information for a magnetic field may be extracted from the first material when a probe laser 119 is applied to the material. For example, when the material is exposed to a magnetic field, the resonant frequencies 121 for a point defect may shift based on the orientation of the point defect in relation to the experienced magnetic field. Thus, when the point defects in the material are in multiple different orientations, the point defects in the material may have separate resonant frequencies associated with each of the different orientations of the point defects. Therefore, vector information for the magnetic field may be determined by identifying which resonances correspond to the different orientations of the point defects in the material. In some implementations, biased magnetic fields may be applied to the material to aid in determining which resonance frequencies are associated with particular orientations of the point defects.

In embodiments described herein, the material may be incorporated within a magnetometer that exposes the material to a pump light 113 to cause the point defects within the material to move to the excited triplet state. The magnetometer may also expose the first material to RF energy in a range of frequencies that includes the resonant frequency 121 for the first material, where a probability of intersystem crossings 117 to shelved states 109 and 111 increases at the resonant frequency 121 as described above. Additionally, the material may be exposed to a probe laser 119, where the probe laser 119 is absorbed by point defects in the shelved states 109 and 111. Accordingly, an applied microwave signal may be swept through a range of frequencies to identify the resonant frequencies 121 associated with the different orientations of the point defects within the material. The resonant frequencies 121 may be identified when the intensity of the applied probe laser 119 that passes through the material decreases, indicating that the applied probe laser 119 was absorbed by the point defects within the material. Based on the identified resonant frequencies 121, a magnetic field experienced by the material may be calculated with high sensitivity to magnetic field changes; low size, weight, and power; and a robustness that could enable the use of a resulting magnetometer in many magnetic based/aided applications such as in navigation.

Figure 2:
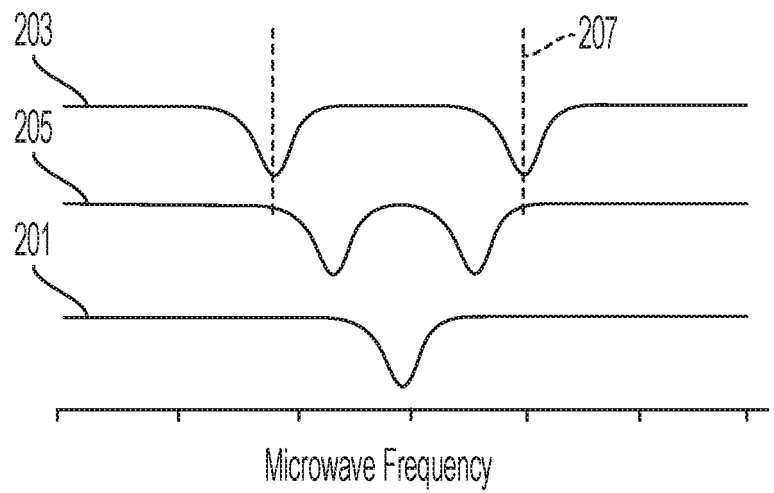
FIG. 2 is a graph illustrating the detection of a magnetic field based on the identification of resonance lines in an applied microwave field according to an aspect of the present disclosure.

FIG. 2 is a graph illustrating the detection of a magnetic field based on the identification of resonance lines in an applied microwave field that is swept through a range of frequencies. As described above, a material may be exposed to a range of microwave frequencies, where the range of applied frequencies includes the different resonant frequencies for the material. Additionally, the different resonant frequencies are associated with the strength of the magnetic fields experienced by the material. Further, the first material may have different resonant frequencies associated with the different orientations of point defects within the material.

As illustrated, FIG. 2 shows various graphs of the intensity of a probe laser as emitted from the material at different microwave frequencies applied to the first material for three different magnetic field strengths. For example, graph 201 shows the intensity of the emitted probe laser at different frequencies when the material is not exposed to a magnetic field. When a probe laser is introduced into a material in the absence of an applied magnetic field, the material may not experience a Zeeman shift and the probe laser may be absorbed at the single resonant frequency for the material. Accordingly, the intensity of the light 201 may decrease at the single resonant frequency for the material.

Additionally, when the material is exposed to different magnetic field strengths, the resonant frequency may experience a frequency shift in proportion to the experienced magnetic field strength. For example, graph 205 and graph 203 illustrate an intensity of the emitted probe laser by the material in the presence of different magnetic field strengths. For example, the magnetic field strength experienced by the material associated with the graph 203 is greater that the magnetic field strength experienced by the material associated with the graph 205. Accordingly, the magnitude of the shift of the resonant frequencies is greater when the material is exposed to a greater magnetic field strength. To identify the magnitude of the shift of the resonant frequency, a system may identify the frequencies 207 associated with decreases in the intensity of the probe laser emitted by the material. Based on the magnitude of the shift of the resonant frequency, a system may determine the magnetic field experienced by a point defect. Additionally, when there are multiple resonant frequencies, the system may identify the orientations of the point defects associated with the different resonant frequencies and the direction of the experienced magnetic field.

Figure 3:
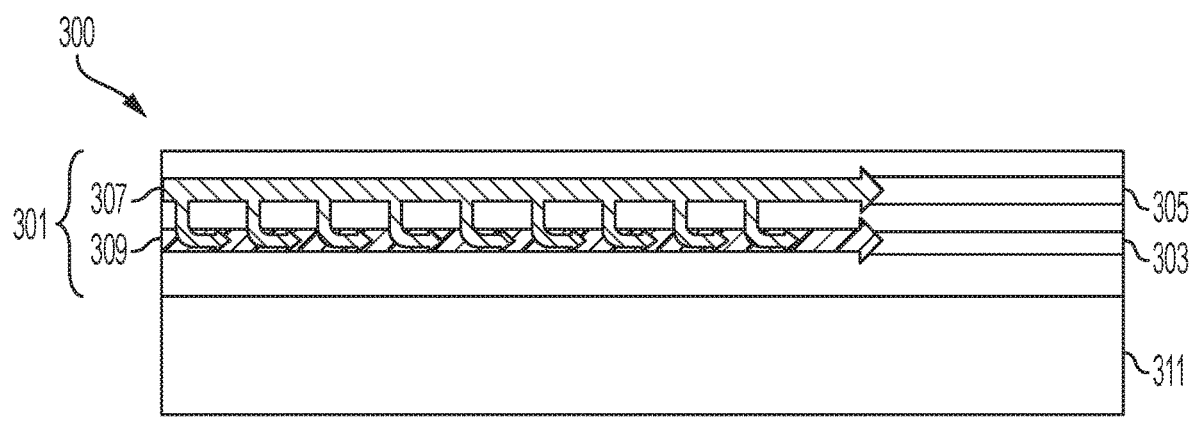
FIG. 3 is a diagram illustrating a waveguide structure that can be used for detecting magnetic fields according to an aspect of the present disclosure.

FIG. 3 is a diagram illustrating a waveguide structure 300 that can be used within a system for detecting magnetic fields. As illustrated, the waveguide structure may include a substrate 311. The substrate 311 may be fabricated from any material capable of supporting the fabrication of additional layers thereon. For example, the substrate 311 may be a silicon substrate. Additionally, the substrate 311 may have a waveguide layer 301, where the waveguide layer 301 has a first waveguide 303 and a second waveguide 305 formed therein. In certain embodiments, the waveguide layer 301 may be fabricated from silicon oxide, however, the waveguide layer 301 may be fabricated from other materials having similar properties.

In certain embodiments, the first waveguide 303 may be fabricated from a first material that is substantially similar to the material described above in connection with FIGS. 1 and 2 and the second waveguide 305 may be fabricated from a second material. For example, the first waveguide 303 may be fabricated from NV diamond and the second waveguide 305 may be fabricated from a nitride or other similar material. To fabricate the first waveguide 303, a portion of the waveguide layer 301 may be fabricated upon the substrate 311. When the portion of the waveguide layer 301 is fabricated, the first material may be deposited on the portion of the waveguide layer 301 in areas associated with the first waveguide 303. When the first material is deposited, additional portions of the waveguide layer 301 may be fabricated above the first waveguide 303. When the additional portions of the waveguide layer 301 are fabricated, the second material may be deposited on the additional portions of the waveguide layer 301 in areas associated with the second waveguide 305. When the second material has been deposited, the remaining portions of the waveguide layer 301 may be fabricated. The, substrate 311, waveguide layer 301, the first waveguide 303, and the second waveguide 305 may be fabricated using processes such as chemical vapor deposition or other methods suitable for fabricating the various layers of the waveguide structure 300. As illustrated, the first waveguide 303 is fabricated before the second waveguide 305. It may be recognized that the second waveguide to 305 may be fabricated at any time in relation to the first waveguide 303 so long as the position of the second waveguide 305 in relation to the first waveguide 303, as described below, is maintained.

In certain embodiments, the first waveguide 303 and the second waveguide 305 may be fabricated in parallel to one another such that light propagating through the second waveguide 305 is coupled into the first waveguide 303. For example, a pump laser 307 may be introduced into the second waveguide 305 that is coupled from the second waveguide 305 into the first waveguide 303. In some implementations, the pump laser 307 may be at the frequency of the pump light 119 described above in connection with FIG. 1. For example, when the first waveguide 303 is an NV diamond waveguide, the pump laser 307 may be a laser having a wavelength of 532 nm. Accordingly, as the pump laser 307 is coupled from the second waveguide 305 into the first waveguide 303, the pump laser 307 may cause the point defects within the first waveguide 303 to transition to excited triplet states.

In some embodiments, the physical relationship between the second waveguide 305 and the first waveguide 303 is changed such that the pump laser 307 is gradually coupled from the second waveguide 305 into the first waveguide 303. In some embodiments, the physical relationship between the second waveguide 305 and the first waveguide 303 is changed such that the pump laser 307 is gradually coupled into the first waveguide 303 along a coupling length through which the first waveguide 303 and the second waveguide 305 are proximate to one another. Further, in some implementations, the pump laser 307 is substantially coupled into the first waveguide 303 such that the pump laser 307 no longer propagates within the second waveguide 305 after the coupling length of the first waveguide 303 and the second waveguide 305. By gradually coupling the pump laser 307 from the second waveguide 305 into the first waveguide 303, the amount of point defects in the first waveguide 303 that transition to the excited triplet states increases.

In certain embodiments, a probe laser 309 may be introduced from a laser source into the first waveguide 303. The probe laser 309 may have a wavelength that is absorbed by point defects in the shelved states within the first material.

For example, when the first waveguide 303 is fabricated from NV diamond, the probe laser 309 may have a wavelength of 1042 nm.

When the waveguide structure 300 is exposed to a signal having the resonant frequency of the first material, the pump laser 307, coupled from the second waveguide 305 into the first waveguide 303, may cause the point defects within the first waveguide 303 to move to the shelved states. As the pump laser 307 is gradually coupled into the first waveguide 303 along the coupling length between the first waveguide 303 and the second waveguide 305, the point defects may absorb the probe laser 309 along the coupling length in the presence of a signal having the resonant frequency of the first material. Additionally, as the resonance frequency of the first material changes when exposed to a magnetic field, the frequency of the applied signal may be varied to identify frequencies at which the probe laser 309 is absorbed by the point defects within the first waveguide 303. The different identified frequencies may be identified to determine the magnitude and direction of the magnetic field as described above.

The use of waveguides as discussed in FIG. 3 increases the interaction length of light within a first material. As discussed above, using the parallel first waveguide 303 and second waveguide 305, a pump laser 307 may be slowly coupled into the first waveguide 303 that functions as a probe waveguide with a probe laser 309 propagating therein. Slow coupling of the pump laser 307 into the first waveguide 303 may be used because the pump laser 307 may be absorbed at a faster rate by the first material than the absorption of the probe laser 309 by the first material. For example, NV diamond absorbs the pump laser 307 around 10 times faster than the probe laser 309.

If the pump laser 307 and the probe laser 309 were both introduced into the first waveguide 303 (as opposed to slowly coupling the pump laser 307 into the first waveguide 303 using the second waveguide 305), the length of the first waveguide 303 may be increased to allow for the absorption of the probe laser 309 for better contrast of the absorption of the probe laser 309 at for various signal frequencies but the pump laser 307 would be absorbed in the first 10% of the length of the first waveguide 303. Thus, the probe laser 309 would not be able to take advantage of the increased length of the first waveguide 303. Conversely, if the first waveguide 303 were shorter, i.e., the absorption length of the pump laser 307, the probe laser 309 would be absorbed through a short distance but would lack contrast of the absorption of the probe laser 309 for the various applied signal frequencies. Accordingly, due to the decreased contrast, the resulting measurements would have less accuracy.

Thus, by slowly leaking the pump laser 307 into the first waveguide 303, the waveguide may provide increased absorption of the probe laser 309 along a shorter length of the first waveguide 303, leading to greater contrast along with efficient absorption of the pump laser 307 along the coupling length between the first waveguide 303 and the second waveguide 305. As described below, light may be slowly coupled from the second waveguide 305 to the first waveguide 303 in such a way that the pump laser 307 has a substantially constant intensity within the first waveguide 303 throughout the coupling length of the first waveguide 303.

Figure 4:
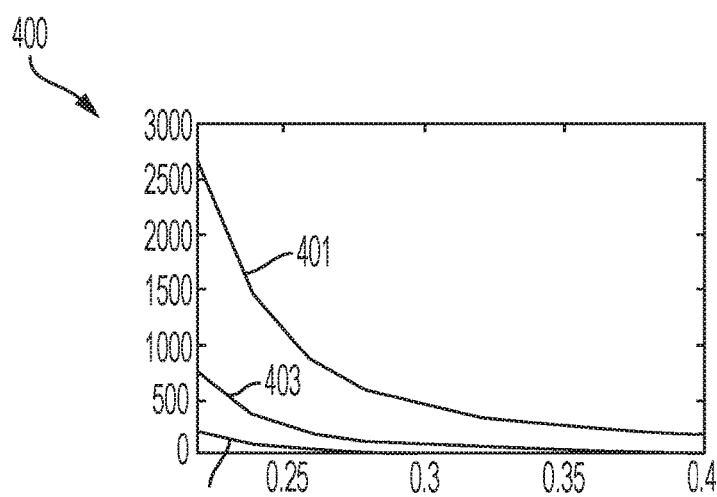
FIG. 4 is a graph illustrating the effects of different separation distances between waveguides in a waveguide structure for detecting magnetic fields according to an aspect of the present disclosure.

FIG. 4 is a graph illustrating the effects of different separation distances between waveguides in a waveguide structure, such as waveguide structure 300 in FIG. 3, for detecting magnetic fields. As shown, the various coupling coefficients for various widths for the second waveguide 305 made from the second material are shown. For example, graph 401 illustrates the coupling coefficients for two coupled waveguides that are separated by 400 nm, graph 403 illustrates the coupling coefficients for two coupled waveguides that are separated by 500 nm; and graph 405 illustrates the coupling coefficients for two coupled waveguides that are separated by 600 nm. As shown, the rate that light is coupled from the second waveguide 305 into the first waveguide 303 along the coupling length of the waveguide structure 300 is dependent on both the distance between the first waveguide 303 and the second waveguide 305 and the width of the second waveguide 305 in relation to the width of the first waveguide 303. Accordingly, to control the rate at which light is coupled from the second waveguide 305 into the first waveguide 303 along the coupling length of the waveguide structure, one or both of the distance between the first waveguide 303 and the second waveguide 305 and the width of the second waveguide 305 in relation to the width of the first waveguide 303 may be varied along the coupling length.

Figure 5:
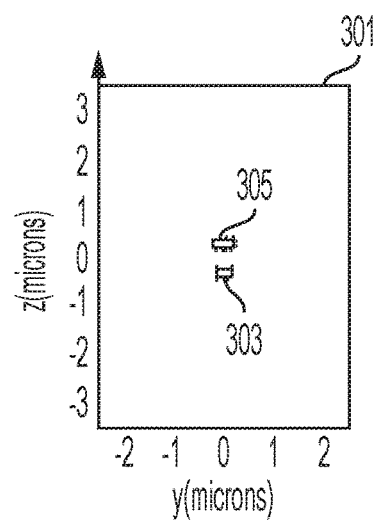
FIG. 5 is a cross section diagram illustrating the position of the different waveguides in relation to one another in a waveguide structure for detecting magnetic fields according to an aspect of the present disclosure.

FIG. 5 is a cross section diagram illustrating an exemplary positioning of the first waveguide 303 in relation to the second waveguide 305 within the waveguide layer 301 as described above in FIG. 3. As shown, the second waveguide 305 may be positioned above the first waveguide 303. Alternatively, the first waveguide 303 may be positioned above the second waveguide 305. Further, the first waveguide 303 and second waveguide 305 may be positioned side by side.

Figure 6:
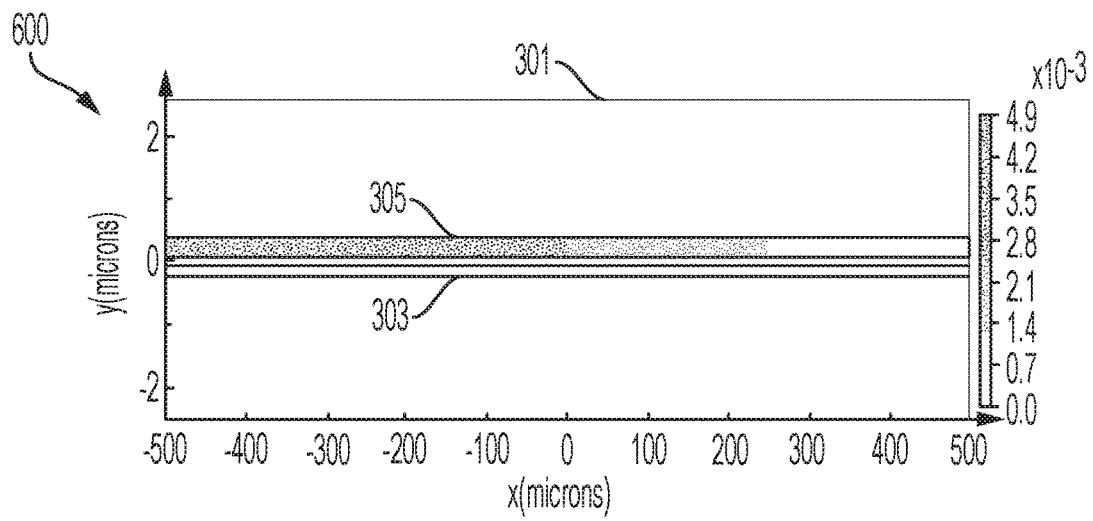
FIG. 6 is a graph illustrating the intensity of light within a waveguide across the length of the waveguide in a waveguide structure for detecting magnetic fields according to an aspect of the present disclosure.

FIG. 6 is a graph 600 illustrating the intensity of a pump laser 307 within a waveguide layer 301 across the coupling length of the second waveguide 305 and the first waveguide 303. As shown, the left side of the graph 600 illustrates the beginning of the coupling length and the right side of the graph illustrates the end of the coupling length. As shown, the intensity of the pump laser 307 within the second waveguide 305 gradually decreases across the coupling length as the light is coupled into the first waveguide 303 as described above. Additionally, the intensity of the pump laser 307 within the first waveguide 303 may remain constant because the light of the pump laser 307 may be linearly absorbed by the material of the first waveguide 303 when the light is coupled into the first waveguide 303 from the second waveguide 305 due to a physical relationship of the first waveguide 303 to the second waveguide 305.

Figure 7:
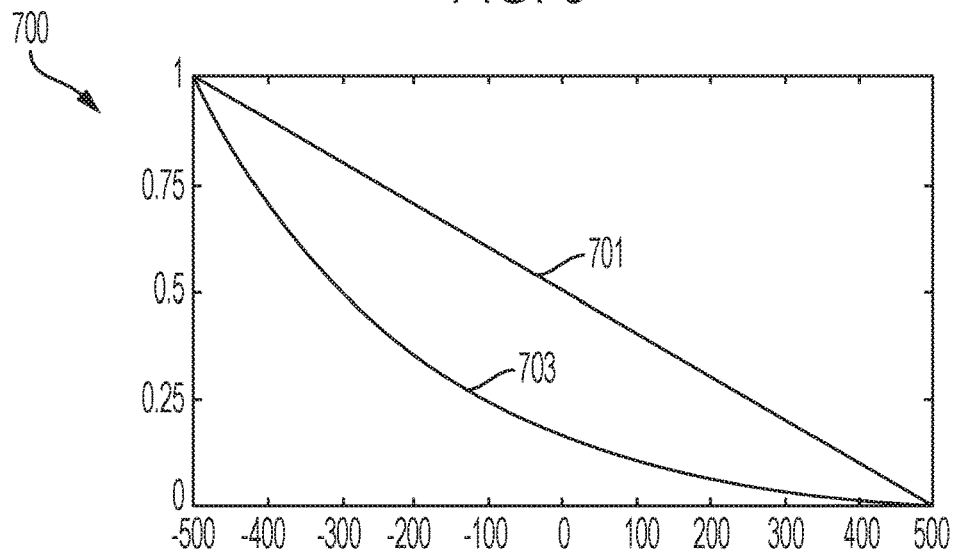
FIG. 7 is a graph illustrating the power of light within a waveguide for different waveguide widths in a waveguide structure for detecting magnetic fields according to an aspect of the present disclosure.

FIG. 7 is a graph illustrating the power of the pump laser 307 propagating within the second waveguide 305 across the coupling length of the second waveguide 305 for different waveguide shapes. For example, graph 703 illustrates the power of the pump laser 307 within the second waveguide 305 when the shape of the second waveguide 305 (in relation to the shape of the first waveguide 303) and the distance between the second and first waveguides 305 and 303 is constant throughout the coupling length. As shown in graph 703, the light is coupled from the second waveguide 305 into the first waveguide 303 at a constant attenuation coefficient. Conversely, graph 701 illustrates the power of the pump laser 307 within the second waveguide 305 when the shape of the second waveguide 305 (in relation to the shape of the first waveguide 303) and the distance between the second and first waveguides 305 and 303 varies such that the power of the pump laser 307 within the second waveguide 305 decreases linearly. When the power decreases linearly, the pump laser 307 may be coupled into the first waveguide 303 at a linear rate and the point defects within the first waveguide 303 may also linearly absorb the probe laser 309 along the coupling length. As the probe laser 309 is linearly absorbed, the sensitivity of the first waveguide 303 to magnetic fields may be consistent along the coupling length of the first waveguide 303.

Figure 8:
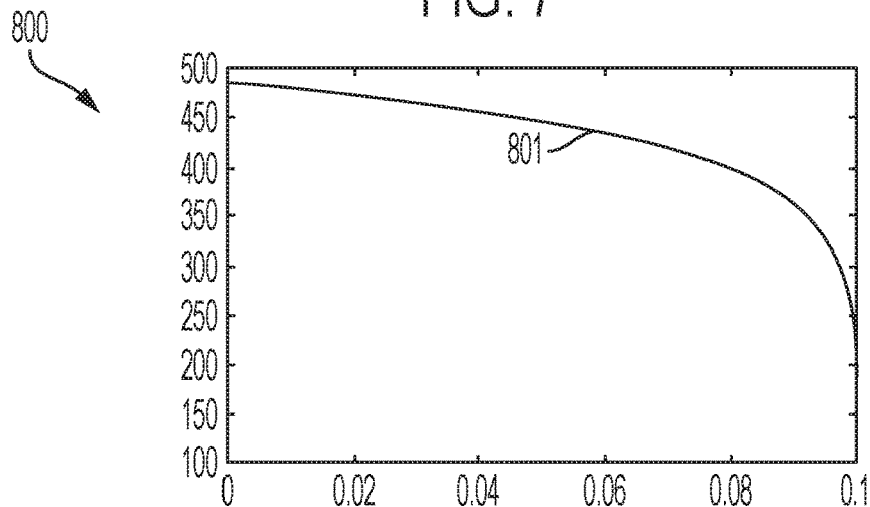
FIG. 8 is a graph illustrating a varying width of a waveguide along the coupling length of the waveguide in a waveguide structure for detecting magnetic fields according to an aspect of the present disclosure.

FIG. 8 is a graph illustrating a varying width of the second waveguide 305 along the coupling length of the second waveguide 305. As shown, the width of the second waveguide 305 may be decreased along the coupling length of the first waveguide 303 and the second waveguide 305. For example, the width of the second waveguide 305 may be decreased over the coupling length such that the pump laser 307 is linearly coupled into the first waveguide 305 as shown in graph 701.

Figure 9:
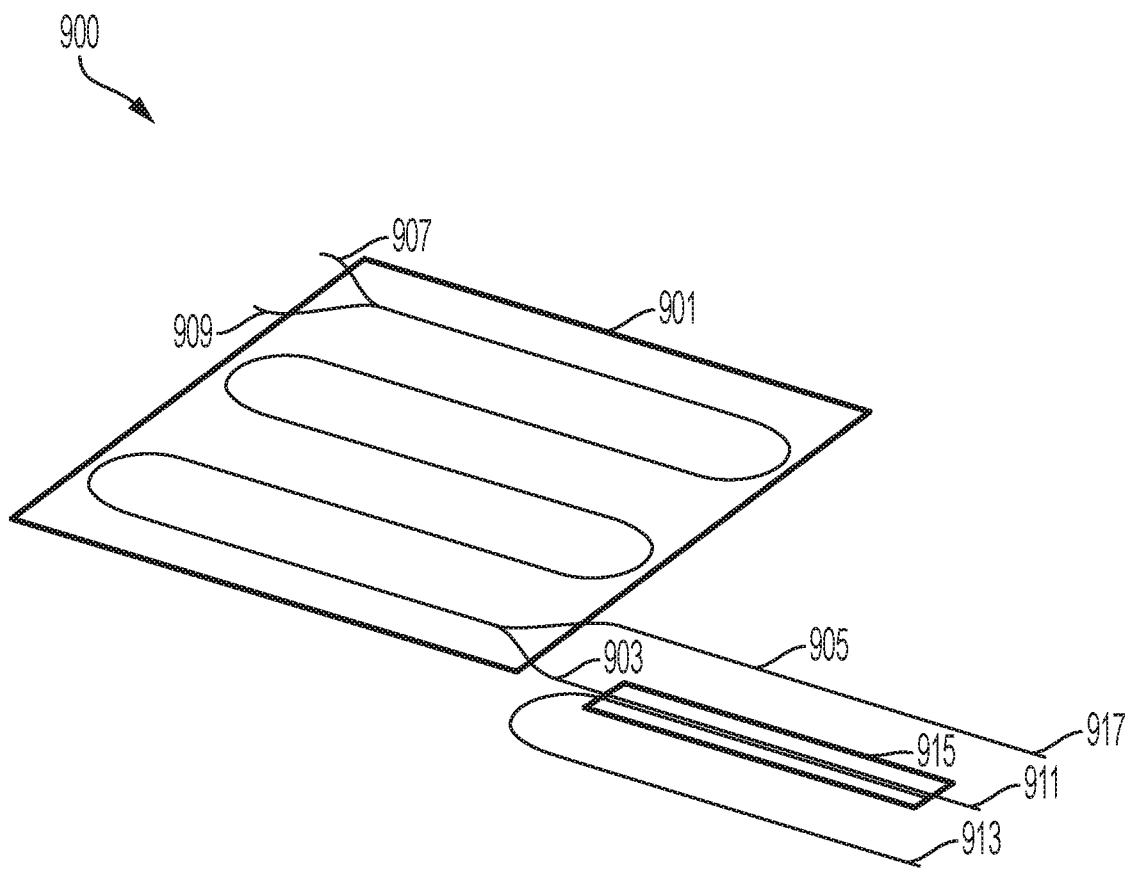
FIG. 9 is a diagram of a waveguide system used for detecting magnetic fields according to an aspect of the present disclosure.

FIG. 9 is a diagram of a waveguide system that may be used for detecting magnetic fields. As illustrated, the waveguide system 900 may include a first waveguide 903 and a second waveguide 905 that respectively function in a similar manner as described above with respect to the first waveguide 303 and the second waveguide 305. The waveguide system 900 may include an absorption region 901. As used herein, the absorption region 901 may refer to a region within the waveguide system 900 where the first waveguide 903 and the second waveguide 905 extend proximate to one another through a coupling length such that a pump laser 907, introduced into the second waveguide 905 from a pump laser source, is coupled into the first waveguide 903 as described above in relation to the pump laser 307.

In certain embodiments, the pump laser 907 is introduced into the second waveguide 905 and a probe laser 909 is introduced into the first waveguide 903 by a probe laser source. In the presence of a resonant frequency signal, the probe laser 909 may be absorbed by the point defects within the first waveguide 903 such that the power of the probe laser 909 propagating within the first waveguide 903 experiences a decrease in power as the probe laser propagates through the absorption region 901.

To monitor the power of the probe laser 909 within the first waveguide 903 after propagation through the absorption region 901, the waveguide system 900 may include a filter 915. In certain embodiments, the filter 915 may receive light from the first waveguide 903 after the light has passed through the absorption region 901. The filter 915 may reflect the light at the frequency of the probe laser 909 through a reflection port 913 and allow light at other frequencies (such as the fluorescence frequencies) to pass through to a filter output port 911. The pump laser 907 passes through the pump outlet port 917 after leaving the absorption region 901. In some implementations, the power of the pump laser 907 at the pump outlet port 917 may be substantially at or near zero as most of the pump laser 907 may be coupled into the first waveguide 903.

In some embodiments, the light at the reflection port 913 may be coupled to a photodetection device such as a photodetector or camera, where the photodetection device monitors the intensity of the received light. During operation, microwave radiation or other radio frequency signals may be emitted around the absorption region, where the microwave radiation is swept through a range of frequencies that includes possible resonant frequencies for the first material. For example, a magnetometer, that includes the waveguide system 900, may also include a radio frequency (RF) emitter that is controlled by a processing device. The RF emitter may be an antenna or other similar device that emits RF energy at a particular frequency. Further, the processing device may direct the RF emitter to sweep through a range of frequencies as it emits RF energy, where the range of frequencies includes the resonant frequency for the first material.

In further embodiments, the photodetection device may monitor the light received from the reflection port 913 and provide a signal associated with the intensity of the received light. A processing device may receive the signal and associate the intensity of the received light with the frequency of the RF energy applied to the absorption region 901 by the RF emitter when the received light intensity was measured. The processing device may then execute computer-executable instructions that identify the applied frequencies associated with decreases in light intensity. The processing device may determine that the identified frequencies are the resonant frequencies and calculate a magnitude and direction of magnetic fields applied to the absorption region 901.

The processing device may be implemented using software, firmware, hardware, or other appropriate combinations thereof. The processing device and/or other computational devices may be supplemented by, or incorporated in, especially-designed application-specific integrated circuits (ASICs) or field programmable gate arrays (FPGAs). The processing unit and other competition devices may also include or function with software programs, firmware, or other computer readable instructions for carrying out various process tasks, calculations, and control functions used in the present methods and systems.

Further, the methods described herein may be implemented by computer-executable instructions such as program modules or components, which are executed by at least one processing unit, such as the processing device. Generally, program modules include routines, programs, objects, data components, data structures, algorithms, and the like, which perform particular tasks or implement particular abstract data types. Instructions for carrying out various process tasks, calculations, and generation other data used in the operations of the methods described herein may be implemented in software, firmware, or other computer readable instructions. These instructions are typically stored on any appropriate computer program product that includes a computer-readable medium used for storage of computer-readable instructions or data structures. The computer-readable medium may be any available media that can be accessed by a general purpose or special purpose computer or processor, or any programmable logic device. In certain implementations, the computer readable medium may be stored on a memory unit in communication with the processing device.

Suitable computer-readable storage media, such as that found as part of the memory unit in communication with the processing device, may include, for example, non-volatile memory devices including semi-conductor memory devices such as random access memory (RAM), read-only memory (ROM), electrically erasable programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer executable instructions or data structures.

Figure 10:
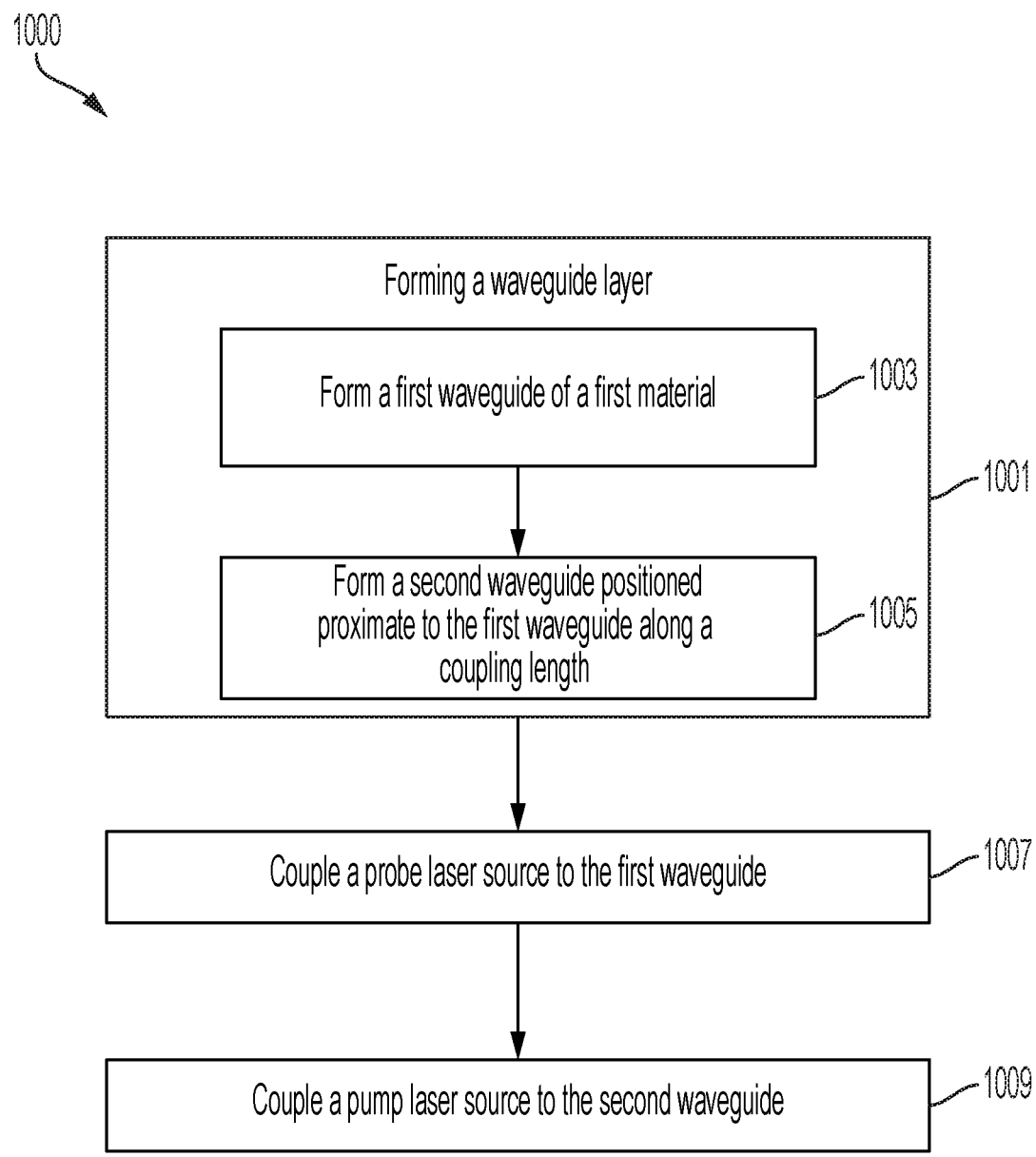
FIG. 10 is a flowchart diagram of a method for fabricating a waveguide structure for detecting magnetic fields according to an aspect of the present disclosure.

FIG. 10 is a flowchart diagram of a method 1000 for fabricating a waveguide structure for detecting magnetic fields. The method 1000 proceeds at 1001, where a waveguide layer is formed. To form the waveguide layer, the method 1000 proceeds at 1003, where a first waveguide is formed of a first material. For example, the first waveguide may be formed of NV diamond, silicon carbide, and other materials having similar physical properties. Further, the method 1000 proceeds at 1005, where a second waveguide is formed by being positioned proximate to the first waveguide along a coupling length. For example, the second waveguide may be positioned such that light propagating within the second waveguide is coupled into the first waveguide.

In additional embodiments, when the waveguide layer is formed, the method 1000 proceeds at 1007, where a probe laser source is coupled to the first waveguide. For example, the probe laser source may be coupled to the first waveguide and configured to emit a probe laser into the first waveguide. Further, the method proceeds at 1009, where a pump laser source is coupled to the second waveguide. For example, the pump laser source may be coupled to the second waveguide and configured to emit a pump laser into the second waveguide at a wavelength that causes the first material to absorb the probe laser when the waveguide layer is exposed to one or more resonant frequencies for the first material.

EXAMPLE EMBODIMENTS

Example 1 includes a device comprising: a substrate; a radio frequency emitter that emits energy in a range of radio frequencies; a waveguide layer formed on the substrate, the waveguide layer comprising: a first waveguide of a first material, wherein a probe laser is propagating within the first waveguide; and a second waveguide, wherein the second waveguide is positioned proximate to the first waveguide along a coupling length such that a pump laser propagating within the second waveguide is coupled into the first waveguide along the coupling length, wherein the pump laser causes the first material to absorb the probe laser at one or more frequencies in the range of frequencies; and a processing device that calculates a magnetic field strength based on an identification of the one or more frequencies.

Example 2 includes the device of Example 1, wherein the first material is nitrogen vacancy diamond.

Example 3 includes the device of any of Examples 1-2, wherein the second material is a nitride.

Example 4 includes the device of any of Examples 1-3, wherein the processing device calculates a magnetic field direction based on an identification of the one or more frequencies.

Example 5 includes the device of any of Examples 1-4, wherein an output of the first waveguide is provided to a photodetection device.

Example 6 includes the device of Example 5, wherein the output of the first waveguide is provided to the photodetection device by a filter that provides light at a frequency of the probe laser to the photodetection device.

Example 7 includes the device of any of Examples 1-6, wherein the pump laser is linearly absorbed by the first material of the first waveguide from the second waveguide along the coupling length.

Example 8 includes the device of any of Examples 1-7, wherein the width of the second waveguide varies through the coupling length.

Example 9 includes the device of any of Examples 1-8, wherein a distance between the first waveguide and the second waveguide varies through the coupling length.

Example 10 includes a method comprising: forming a waveguide layer, wherein forming the waveguide layer comprises: forming a first waveguide of a first material; and forming a second waveguide positioned proximate to the first waveguide along a coupling length such that light propagating within the second waveguide is coupled into the first waveguide along the coupling length; coupling a probe laser source to the first waveguide, wherein the probe laser source is configured to emit a probe laser into the first waveguide; and coupling a pump laser source to the second waveguide, wherein the pump laser source is configured to emit a pump laser into the second waveguide at a wavelength that causes the first material to absorb the probe laser when the waveguide layer is exposed to one or more resonant frequencies for the first material.

Example 11 includes the method of Example 10, wherein the first material is nitrogen vacancy diamond.

Example 12 includes the method of any of Examples 10-11, wherein the second material is a nitride.

Example 13 includes the method of any of Examples 10-12, further comprising calculating a magnetic field direction based on an identification of the one or more resonant frequencies.

Example 14 includes the method of any of Examples 10-12, further comprising providing an output of the first waveguide to a photodetection device.

Example 15 includes the method of Example 14, wherein providing an output of the first waveguide to a photodetection device comprises passing the output of the first waveguide through a filter that reflects light at a frequency of the probe laser through a reflection port that is coupled to the photodetection device.

Example 16 includes the method of any of Examples 10-15, wherein a physical relationship between the first waveguide and the second waveguide along the coupling length causes the pump laser to be linearly absorbed by the first material of the first waveguide from the second waveguide along the coupling length.

Example 17 includes the method of Example 16, wherein the physical relationship between the first waveguide and the second waveguide comprises a width of the second waveguide that varies through the coupling length.

Example 18 includes the method of any of Examples 16-17, wherein the physical relationship between the first waveguide and the second waveguide comprises a distance between the first waveguide and the second waveguide that varies through the coupling length.

Example 19 includes a system comprising: a pump laser source that provides a pump laser; a probe laser source that provides a probe laser; a radio frequency emitter that emits energy in a range of frequencies; an absorption region comprising: a first waveguide of a first material, wherein the probe laser is coupled into the first waveguide; and a second waveguide, wherein the pump laser is coupled into the second waveguide, the second waveguide positioned proximate to the first waveguide along a coupling length such that the pump laser propagating is coupled into the first waveguide along the coupling length, wherein the pump laser causes the first material to absorb the probe laser at one or more frequencies in the range of frequencies; and a filter coupled to an output of the first waveguide that provides a filtered probe laser through an output port; a photodetection device coupled to the output port; a processing device that calculates a magnetic field strength based on an identification of the one or more frequencies associated with decreased intensity of the probe laser as detected by the photodetection device.

Example 20 includes the system of Example 19, wherein a physical relationship between the first waveguide and the second waveguide along the coupling length causes the pump laser to be linearly absorbed by the first material of the first waveguide from the second waveguide along the coupling length.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A device comprising:
   a substrate;
   a radio frequency emitter that emits energy in a range of radio frequencies;
   a waveguide layer formed on the substrate, the waveguide layer comprising:
      a first waveguide of a first material, wherein a probe laser is propagating within the first waveguide; and
      a second waveguide of a second material, wherein the second waveguide is positioned proximate to the first waveguide along a coupling length such that a pump laser propagating within the second waveguide is coupled into the first waveguide along the coupling length, wherein the pump laser causes the first material to absorb the probe laser at one or more frequencies in the range of frequencies; and
   a processing device that calculates a magnetic field strength based on an identification of the one or more frequencies.

2. The device of claim 1, wherein the first material is nitrogen vacancy diamond.

3. The device of claim 1, wherein the second material is a nitride.

4. The device of claim 1, wherein the processing device calculates a magnetic field direction based on the identification of the one or more frequencies.

5. The device of claim 1, wherein an output of the first waveguide is provided to a photodetection device.

6. The device of claim 5, wherein the output of the first waveguide is provided to the photodetection device by a filter that provides light at a frequency of the probe laser to the photodetection device.

7. The device of claim 1, wherein the pump laser is linearly absorbed by the first material of the first waveguide from the second waveguide along the coupling length.

8. The device of claim 1, whereina width of the second waveguide varies through the coupling length.

9. The device of claim 1, wherein a distance between the first waveguide and the second waveguide varies through the coupling length.

10. A method comprising:
    forming a waveguide layer, wherein forming the waveguide layer comprises:
       forming a first waveguide of a first material; and
       forming a second waveguide of a second material positioned proximate to the first waveguide along a coupling length such that light propagating within the second waveguide is coupled into the first waveguide along the coupling length;
    coupling a probe laser source to the first waveguide, wherein the probe laser source is configured to emit a probe laser into the first waveguide; and
    coupling a pump laser source to the second waveguide, wherein the pump laser source is configured to emit a pump laser into the second waveguide at a wavelength that causes the first material to absorb the probe laser when the waveguide layer is exposed to one or more resonant frequencies for the first material.

11. The method of claim 10, wherein the first material is nitrogen vacancy diamond.

12. The method of claim 10, wherein the second material is a nitride.

13. The method of claim 10, further comprising calculating a magnetic field direction based on an identification of the one or more resonant frequencies.

14. The method of claim 10, further comprising providing an output of the first waveguide to a photodetection device.

15. The method of claim 14, wherein providing the output of the first waveguide to the photodetection device comprises passing the output of the first waveguide through a filter that reflects light at a frequency of the probe laser through a reflection port that is coupled to the photodetection device.

16. The method of claim 10, wherein a physical relationship between the first waveguide and the second waveguide along the coupling length causes the pump laser to be linearly absorbed by the first material of the first waveguide from the second waveguide along the coupling length.

17. The method of claim 16, wherein the physical relationship between the first waveguide and the second waveguide comprises a width of the second waveguide that varies through the coupling length.

18. The method of claim 16, wherein the physical relationship between the first waveguide and the second waveguide comprises a distance between the first waveguide and the second waveguide that varies through the coupling length.

19. A system comprising:
    a pump laser source that provides a pump laser;
    a probe laser source that provides a probe laser;
    a radio frequency emitter that emits energy in a range of frequencies;
    an absorption region comprising:
       a first waveguide of a first material, wherein the probe laser is coupled into the first waveguide; and
       a second waveguide, wherein the pump laser is coupled into the second waveguide, the second waveguide positioned proximate to the first waveguide along a coupling length such that the pump laser propagating is coupled into the first waveguide along the coupling length, wherein the pump laser causes the first material to absorb the probe laser at one or more frequencies in the range of frequencies;
    a filter coupled to an output of the first waveguide that provides a filtered probe laser through an output port;
    a photodetection device coupled to the output port; and
    a processing device that calculates a magnetic field strength based on an identification of the one or more frequencies associated with decreased intensity of the probe laser as detected by the photodetection device.

20. The system of claim 19, wherein a physical relationship between the first waveguide and the second waveguide along the coupling length causes the pump laser to be linearly absorbed by the first material of the first waveguide from the second waveguide along the coupling length.

* * * * *